United States Patent
Saito et al.

[11] Patent Number: 6,106,681
[45] Date of Patent: Aug. 22, 2000

[54] ITO SPUTTERING TARGET AND ITS CLEANING METHOD

[75] Inventors: Toru Saito; Yoshikazu Kumahara, both of Ibaraki-Ken; Katsuya Kuboyama, Fukuoka-ken, all of Japan

[73] Assignee: Japan Energy Corporation, Tokyo, Japan

[21] Appl. No.: 09/170,647

[22] Filed: Oct. 13, 1998

[30] Foreign Application Priority Data

Oct. 13, 1997 [JP] Japan ................................ 9-293151

[51] Int. Cl.$^7$ .............................. C23C 14/34; B08B 3/12; B08B 7/00; B08B 7/04

[52] U.S. Cl. ............................ 204/298.12; 204/298.13; 204/298.03; 204/192.29; 204/192.15; 204/192.13; 134/1; 134/6

[58] Field of Search ................... 204/298.12, 298.13, 204/298.03, 192.29, 192.15, 192.13; 134/1, 6

[56] References Cited

U.S. PATENT DOCUMENTS

| | | | |
|---|---|---|---|
| 5,435,826 | 7/1995 | Sakakibara et al. | 204/298.13 |
| 5,460,793 | 10/1995 | Kano et al. | 423/344 |
| 5,478,456 | 12/1995 | Humpal et al. | 204/192.13 |
| 5,630,918 | 5/1997 | Takahara et al. | 204/298.13 |
| 5,700,419 | 12/1997 | Matsunaga et al. | 264/656 |
| 5,980,815 | 11/1999 | Matsunaga et al. | 264/681 |

FOREIGN PATENT DOCUMENTS

| | | |
|---|---|---|
| 2-259070 | 10/1990 | Japan . |
| 7-207435 | 8/1995 | Japan . |
| 8-060352 | 3/1996 | Japan . |
| 8-60352 | 3/1996 | Japan . |
| 9-104973 | 4/1997 | Japan . |

OTHER PUBLICATIONS

1 page English Abstract of Japanese publication No. 09–104973 (Patent Abstracts of Japan), Apr. 1997.
1 page English Abstract of Japanese publication No. 08–060352 (Patent Abstracts of Japan), Mar. 1996.

*Primary Examiner*—Alan Diamond
*Attorney, Agent, or Firm*—Howson and Howson

[57] ABSTRACT

The present invention provides an ITO sputtering target and a method of cleaning the target. ITO ground powder which is deposited on a surface of the target requires removal to increase the cleanness of the target surface. This prevents the production of nodules caused by sputtering in order to restrain abnormal discharge and prevent the production of particles. Particles deposited on a sputtered surface of an ITO sintered target are removed by subjecting the sputtered surface to multiple-oscillation ultrasonic washing, or alternatively, by sticking an adhesive tape to the sputtered surface, sufficiently rubbing the tape against the surface, and then peeling the tape off the surface. Both methods result in 400 or fewer deposited particles of 0.2 $\mu$m or more average particle diameter being present in a 100 $\mu$m×100 $\mu$m area of the sputtered surface.

8 Claims, 7 Drawing Sheets

ITO SPUTTERING TARGET AND ITS CLEANING METHOD

FIELD OF THE INVENTION

The present invention relates to an ITO sputtering target used to form a transparent conductive film and to a method of cleaning the sputtering target, and more particularly, the present invention relates to a cleaned sputtering target on which sputtering results in few nodules being formed on the film to restrain abnormal discharge and prevent the production of particles.

BACKGROUND OF THE INVENTION

ITO thin films used to form transparent conductive films are widely used as transparent electrodes for display devices, particularly, liquid crystal displays. ITO thin films are often formed by sputtering techniques. However, when an ITO target is used for sputtering, a large number of black protrusions of several $\mu$m to several mm size appear in an eroded part of a surface of the target. These protrusions are considered to be low-level oxides of indium and are commonly called nodules.

As the amount of sputtering time increases, the number and size of nodules increase and they gradually spread over the target surface. Conductivity of the nodules are lower than that of other portions, and if a large amount of nodules are produced, abnormal discharge (arcing) may often occur to produce particles on the ITO film or to preclude sputtering from being continued.

The production of nodules is unique to the ITO sputtering target used to form a transparent conductive film. If the number of nodules on the target surface increases abnormally, the sputtering operation is halted to execute reproduction processing in which the nodules produced on the target surface are scraped off. The halting of sputtering, however, may significantly degrade the productivity of continuous operations. Despite its simplicity, the reproduction operation requires appropriate skills and an appropriate amount of time and is thus cumbersome.

In addition, the reproduction processing for scraping the nodules off has limited results, and it is actually difficult to reproduce the ITO sputtering target to the extent that it is equivalent to a newly created target. Thus, the target may frequently become unavailable due to an increase in the number of nodules before it is fully used (i.e., before a target is consumed in a normal state). Consequently, to improve productivity while reducing material costs, an ITO sputtering target which produces a lesser amount of nodules is required.

The ITO sputtering target is generally obtained by grinding a sintered compact using a lathe or the like. Therefore, one of the causes of the production of nodules is assumed to be ITO ground powders which become deposited on the target surface. Accordingly, the amount of nodules produced is expected to be decreased by reducing the amount of ITO ground powders on the target surface. It has been difficult, however, to determine the threshold of the amount of ITO ground powders at which the nodule reduction effect starts to work and to reduce the amount of ITO ground powders to this threshold during actual operations.

Consequently, a polishing technique using a wet rotary polishing machine has been proposed to experimentally reduce the amount of ITO ground powders deposited on the target surface (Japanese Patent Application Laid-Open No. 8-60352), or a sandblast has been used to reduce the amount of ground powders (Japanese Patent Application Laid-Open No. 9-104973).

These methods, however, can reduce the amount of ground powders to some degree, but are still insufficient due to a large amount of ITO ground chips left on the surface. Therefore, since the threshold of the amount of ground powders is unknown, it is more appropriate to believe that the amount of ground powders deposited on the target surface has not actually been proved to be one of the causes of the production of nodules.

OBJECTS OF THE PRESENT INVENTION

An object of the present invention is to provide an ITO sputtering target which is used to form a transparent conductive film and which has a purified target surface.

Another object of the present invention is to provide an ITO sputtering target used to form a transparent conductive film with sputtering techniques which result in few nodules so that abnormal discharge is restrained and the production of particles is prevented.

A further object of the present invention is to provide an improved method of cleaning an ITO sputtering target.

SUMMARY OF THE INVENTION

According to the present invention, an ITO sputtering target is provided having a relatively particle-free surface on which sputtering takes place. The surface has at least an area 100 $\mu$m by 100 $\mu$m on which 400 or fewer particles are deposited. Each particle has an average particle diameter of 0.2 $\mu$m or greater.

According to another aspect of the present invention, an ITO sputtering target cleaning method is provided which includes the step of subjecting the surface of the ITO sputtering target to multiple-oscillation ultrasonic washings. Alternatively, the ITO sputtering target method includes sticking an adhesive tape to the target surface and then peeling the adhesive tape therefrom to remove particles deposited thereon.

DETAILED DESCRIPTION OF THE PREFERRED EMBODIMENT

To manufacture an ITO sputtering target, for example, indium oxide powders of average particle size 2 $\mu$m and tin oxide powders of the same particle size are weighed using a balance so that their weight ratio is 90:10, a molding binder is added to these powders, and the mixture is uniformly mixed together. Then, the mixed powders are charged in molds, molded under pressure, and then sintered at a high temperature.

The sintered compact obtained above is ground using a surface grinder to obtain an ITO sputtering target material, which, however, has a large amount of ITO ground chips deposited on its surface. Such ITO ground chips are a direct and major cause of the production of nodules. Thus, during a finishing step, for example, sandpaper is used to polish and smooth the ITO target surface until no traces of the grinding stone are observed.

Sandblasting with a blast material such as glass, alumina, or zirconia beads, is also effective during the finishing step. Such processing is effective in reducing the protruding and recessed portions of the ITO target surface that have edges and in removing ground chips from between the protruding and recessed portions.

Then, the target is washed using, for example, air blowing or flushing. When air blowing is used to remove foreign matter, it is more effective to remove the foreign matter by sucking air from the opposite side of a nozzle toward a dust collector. It has been found, however, that the effect of the air blowing, or flushing, is limited and that fine chips remain on the surface after such processing.

Ultrasonic washing can be carried out in an attempt to solve this problem. This processing is more effective than the other washing processes, but a simple ultrasonic washing operation has been found not to be very effective.

Thus, various tests have been undertaken to find methods which are particularly effective. Tests have shown that an effective method includes ultrasonic washing using multiple-oscillations between 25 and 300 kHz. Another effective method was determined to be the removal of particles deposited on the sputtered surface by sticking adhesive tape on the surface followed by peeling the tape therefrom (a tape peeling method). However, the ultrasonic washing using multiple-oscillation was determined to be the most effective.

During testing, when 25 or 75 kHz single frequency ultrasonic washing was applied to the target, almost no washing effect was obtained. As shown in the embodiments described below, an excellent washing effect was obtained when ultrasonic washing was executed by an ultrasonic washing procedure which included multiple-oscillation using 12 different frequencies ranging between 25 and 300 kHz at intervals of 25 kHz.

In addition, even fine chips can be completely removed from a ground sintered compact by sticking an adhesive tape (film) to the sputtered surface, rubbing the adhesive tape sufficiently against the sputtered surface, and peeling the adhesive tape off to remove particles deposited on the sputtered surface.

This operation enables charged particles to be reliably captured and collected. The adhesive tape (film) is desirably soft in order to remove ITO ground powders charged in voids or recessed portions on the target surface. The adhesive tape must be such that no adhesive remains on the target surface after the tape has been peeled off.

Although the present method using the adhesive tape (film) is likely to be considered to be relatively simply, no such method has been used as a cleaning method for an ITO sputtering target and the effects of such a method have not been demonstrated. This method has been determine through experimentation to be very effective as a cleaning method for an ITO sputtering target.

Based on the above operations, both the ultrasonic washing using multiple oscillation and the tape peeling method described above reduced down to 400 or less the number of particles (ITO ground powders) of average diameter 0.2 $\mu$m or more deposited in 100 $\mu$m×100 $\mu$m area (100 $\mu$m square surface) of a sputtered surface of an ITO sputtering target. The term "average diameter", as used herein, indicates the average of the diameters of deposited particles when they are considered to be circles, because actually, the particles are not circular.

In particular, the ultrasonic washing using multiple oscillation can further reduce this number and actually reduce down to 100 or less the number of particles (ITO ground powders) of average diameter 0.2 $\mu$m or more deposited in a 100 $\mu$m×100 $\mu$m area of a sputtered surface of an ITO sputtering target.

This is a distinct improvement because the ITO sputtering target product has about 1,000 such particles after conventional washing procedures.

More importantly, by reducing down to 400 or less, preferably, 100 or less, the number of particles (ITO ground powders) of average diameter 0.2 $\mu$m or more deposited in 100 $\mu$m×100 $\mu$m area of an ITO sputtering target, the number of nodules is significantly reduced. Consequently, the cause of the production of nodules, which had only been assumed, has been determined and the critical amount of deposited particles (ITO ground powders) has been determined.

As shown in the following embodiments, the amount of nodules produced on the ITO sputtering target was reduced to eliminate the need to halt the sputtering operation to execute reproduction processing in which the nodules produced on the target surface are scraped off. Even if such processing is required, the number of required steps is reduced to significantly improve productivity.

Even when ITO ground powders are removed using the ultrasonic washing according to this invention, this method is preferably used with surface finishing, such as sandpaper or sandblasting, or cleaning processing based on air blowing or flushing, or the removal of ITO ground powders using adhesive-tape peeling. This is because the form of ITO ground powders and the required degree of removal vary depending on the processing as described above. To efficiently remove such ITO ground powders, surface-finishing and cleaning methods are desirably combined together.

In addition, even when ITO ground powders are removed using the adhesive-tape peeling, this method is particularly preferably when used with surface finishing, such as sandpaper or sandblasting, or cleaning processing based on air blowing or flushing, or ultrasonic washing, particularly, ultrasonic washing using multiple-oscillation between 25 and 300 kHz. This is because the form of ITO ground powders and the required degree of removal vary depending on the processing as described above. To efficiently remove such ITO ground powders, surface-finishing and cleaning methods are desirably combined together as required to take advantage of each of their characteristics.

EMBODIMENTS AND COMPARATIVE EXAMPLES

Subsequently, this invention is described by comparing the preferred embodiments with comparative examples.

Embodiment 1

To manufacture an ITO sputtering target, indium oxide powders of average particle size 2 μm and tin oxide powders of the same particle size are weighed using a balance so that their weight ratio is 90:10. A molding binder is added to these powders, and the mixture is uniformly mixed together. Then, the mixed powders are uniformly charged in molds (165 W×520 L) and molded under a pressure of 800 Kgf/cm$^2$ using a hydraulic press. The molded compact obtained in this manner is sintered in a pressure-sintering furnace in a pure-oxygen-gas atmosphere of 1 atm. (the absolute pressure) at 1640° C. for seven hours.

A sputtered surface of the sintered compact obtained is ground using a surface grinder and its sides are cut using a diamond cutter to obtain an ITO target material. This ITO target material has a density of 7.05 g/cm$^3$.

Then, the ITO target material is bonded to a backing plate. During a surface-finishing step after bonding, sandpaper is used to polish and smooth the material until no traces of the grinding stone are observed. Alternatively, the material is sandblasted using zirconia beads.

Then, air is blown to the sputtered surface, which is then ultrasonic-washed for three minutes by multiple-oscillation using 12 different frequencies between 25 and 300 kHz at intervals of 25 kHz. The frequencies were 25, 50, 75, 100, 125, 150, 175, 200, 225, 250, 275, and 300 kHz. The material is then dried to obtain an ITO sputtering target that is a first embodiment of the present invention.

Comparative Examples 1 to 3

Sputtered surfaces of sintered compacts obtained under the same conditions as in the above described Embodiment 1 were ground using a surface grinder and their sides were cut using a diamond cutter to obtain ITO target materials. The ITO target materials were each bonded to a backing plate. Then, ITO sputtering targets are created by subjecting a sputtered surface of one of the materials to only air blowing (Comparative Example 1), subjecting a sputtered surface of another to air blowing and then to ultrasonic washing using 75 kHz single-frequency-oscillation (Comparative Example 2), and subjecting a sputtered surface of the other to air blowing and then to ultrasonic washing using 25 kHz single-frequency-oscillation (Comparative Example 3).

Comparison Test and Comparison of Embodiment 1 with Comparative Examples to 3

The ITO sputtering targets produced according to Embodiment 1 and Comparative Examples 1 to 3 as described above underwent sputtering tests under the following conditions.

| | |
|---|---|
| Sputter gas | Ar + O$_2$ |
| Sputter gas pressure | 0.5 Pa |
| Sputter gas flow rate | 300 SCCM |
| Oxygen concentration in sputter gas | 1% |
| Leakage magnetic flux density | 400 Gauss |
| Input sputter power density | 1 W/cm$^2$ |
| Sputter time | 20 consecutive hours |

Figure 1:
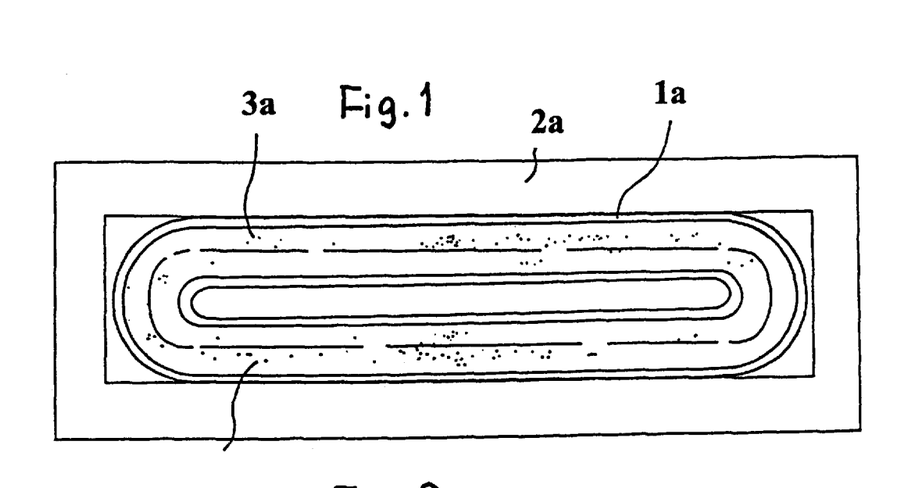
FIG. 1 is a sketch of a target surface that has been subjected to multiple-oscillation ultrasonic washing according the present invention and then to sputtering over 20 consecutive hours.
Figure 2:
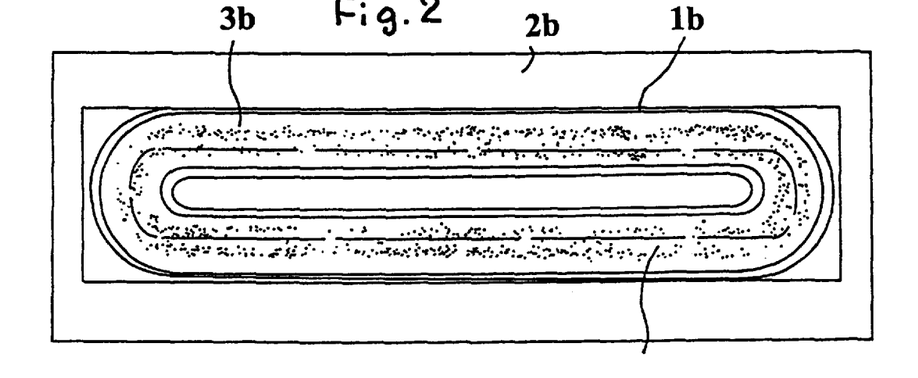
FIG. 2 is a sketch of a target surface that has been subjected to a single-frequency-oscillation ultrasonic washing at 75 kHz and then to sputtering over 20 consecutive hours.
Figure 3:
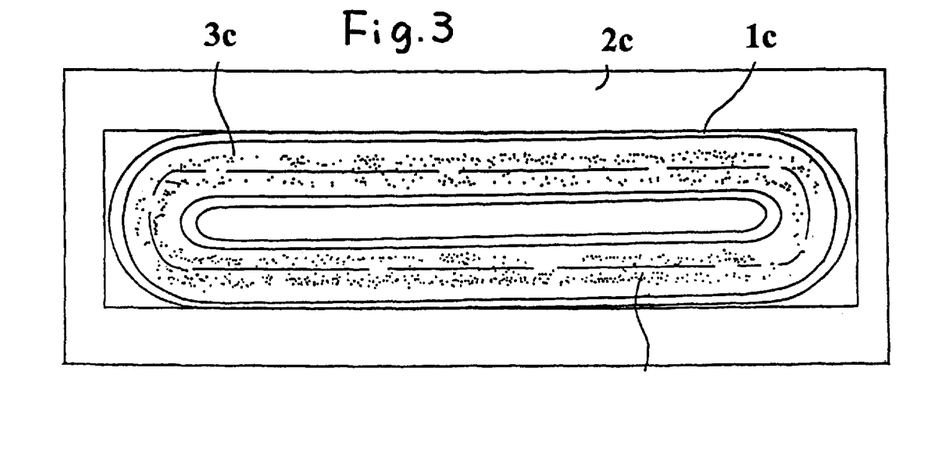
FIG. 3 is a sketch of a target surface that has been subjected to a single-frequency-oscillation ultrasonic washing at 25 kHz, and then to sputtering over 20 consecutive hours.

The appearances of the targets after sputtering under the above conditions are shown in FIGS. 1, 2, and 3. To surface-finish the targets in FIGS. 1 to 3, sandpaper was used to smooth the surfaces. Reference numerals 2a, 2b, and 2c designate a periphery of an apparatus on which targets 1a, 1b, and 1c are installed.

FIG. 1, which corresponds to Embodiment 1, shows a target 1a that has been subjected to air blowing and then to ultrasonic washing for three minutes executed by multiple-oscillation using 12 different frequencies between 25 and 300 kHz at intervals of 25 kHz, and then to the above sputtering.

FIG. 2, which corresponds to Comparative Example 2, shows a target 1b that was subjected to air blowing, ultrasonic washing using 75 kHz single-frequency-oscillation and then to the above sputtering. FIG. 3, which corresponds to Comparative Example 3, shows a target 1c that was subjected to air blowing, ultrasonic washing using 25 kHz single-frequency-oscillation, and then to the above sputtering.

As clearly illustrated in FIGS. 1, 2 and 3, the comparative examples that have been ultrasonic-washed using 75 kHz single-frequency-oscillation (Comparative Example 2) and 25 kHz single-frequency-oscillation (Comparative Example 3) have a large number of black protrusions of several μm to several mm, that is, nodules, in eroded parts, 3b and 3c of a surface of the targets 1b and 1c after sputtering is finished as compared to the eroded part 3a of the present invention which utilizes multiple-oscillation ultrasonic washing. Fewer black spots correspond to a better target.

Table 1 shows the nodule covering rates of Embodiment 1 and Comparative Examples 1 to 3 after the sputtering tests. The "nodule covering rate" indicates in terms of percentage the ratio of "the area of nodules/the area of the eroded part" of the surface of the sputtering target. As clearly shown in Table 1, Embodiment 1 of this invention has a significantly reduced nodule covering rate as compared to Comparative Examples 1, 2 and 3.

For reference, Table 1 shows Comparative Example 1 in which the sputtered surface was subjected to only air blowing. As is apparent from the table, the target of Comparative Example 1 has the worst nodule covering rate. In addition, the targets that were subjected to ultrasonic washing using 75 or 25 kHz single-frequency-oscillation according to Comparative Examples 2 and 3 exhibited small improvements compared to Comparative Example 1, but significant effects cannot be expected of these examples.

TABLE 1

| | Nodule Covering Rate (%) |
|---|---|
| Embodiment 1 (12 frequency-multiple-oscillation) | 0.1 |
| Comparative Example 1 (only air blowing) | 1.5 |
| Comparative Example 2 (75 kHz) | 1.1 |
| Comparative Example 3 (25 kHz) | 1.0 |

Figure 4A:
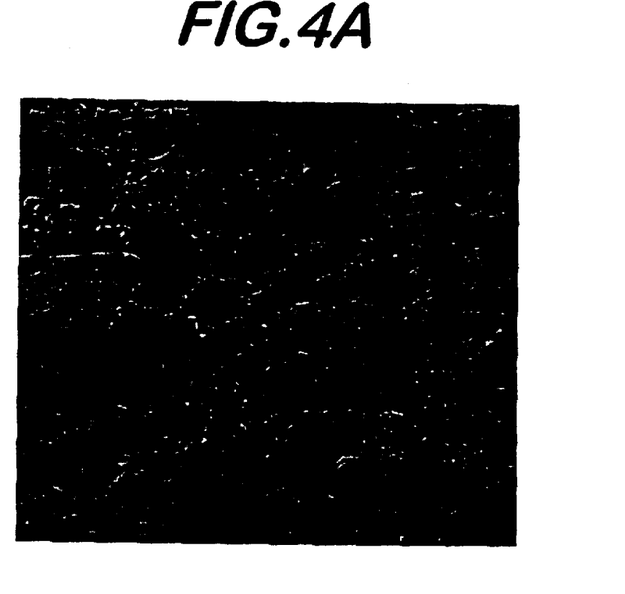
FIGS. 4A and 4B are electron-microscopic photographs of a surface of an ITO target material that has been smoothed with sandpaper and then subjected to air blowing.
Figure 4B:
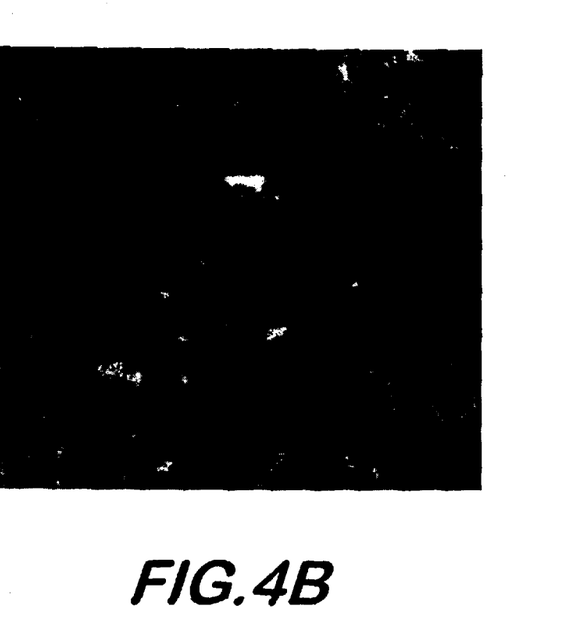

Furthermore, FIGS. 4A and 4B show electron-microscopic photographs of a finished surface of an ITO target material that was smoothed using sandpaper and that was then subjected to only air blowing. FIG. 4A is at 500 magnification, while FIG. 4B is at 5,000 magnification. This magnification also applies to the other photos discussed below. These photos show an ITO target according to Comparative Example 1 prior to the sputtering test.

As is apparent from FIGS. 4A and 4B, an infinite number of sesame-shaped chips are present on the wavy, wrinkled surface of the ITO target according to Comparative Example 1, or in voids therein, prior to the sputtering test.

Figure 5A:
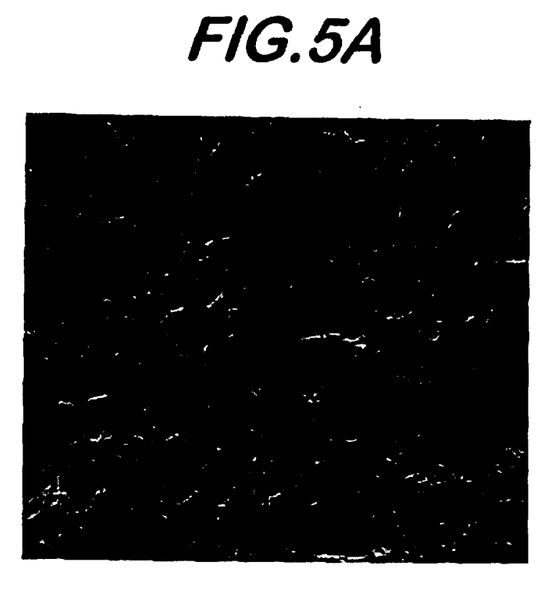
FIGS. 5A and 5B are electron-microscopic photographs of a target surface subjected to air blowing and then to ultrasonic washing using 75 kHz single-frequency-oscillation.
Figure 5B:
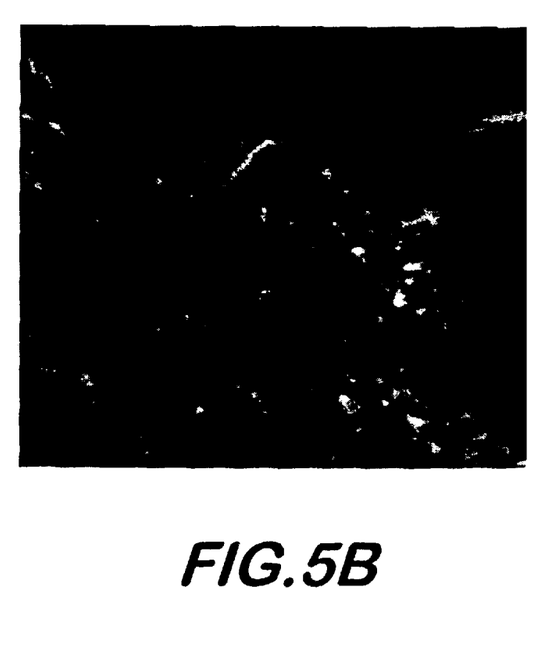

FIGS. 5A and 5B are electron-microscopic photographs of a finished target surface obtained by using sandpaper to smooth the surface and by subjecting it to air blowing and then to ultrasonic washing using 75 kHz single-frequency-oscillation. These photos show an ITO target according to Comparative Example 2 prior to the sputtering test.

As is apparent from FIGS. 5A and 5B, an infinite number of sesame-shaped chips are present on the wavy surface of the ITO target according to Comparative Example 2, or in voids therein, prior to the sputtering test.

Figure 6A:
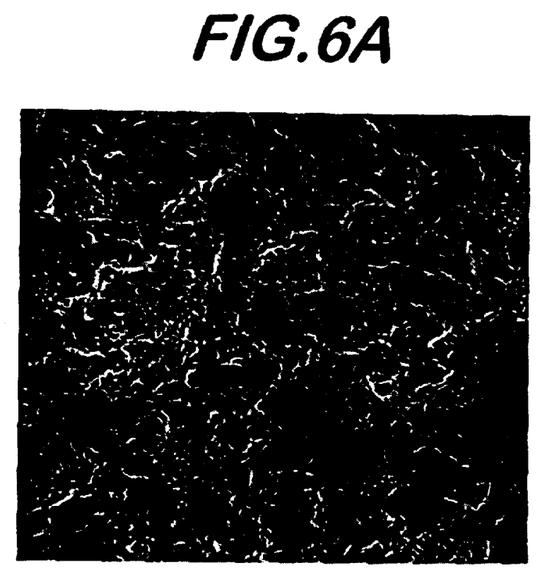
FIGS. 6A and 6B are electron-microscopic photographs of a target surface subjected to air blowing and then to ultrasonic washing using 25 kHz single-frequency-oscillation.
Figure 6B:
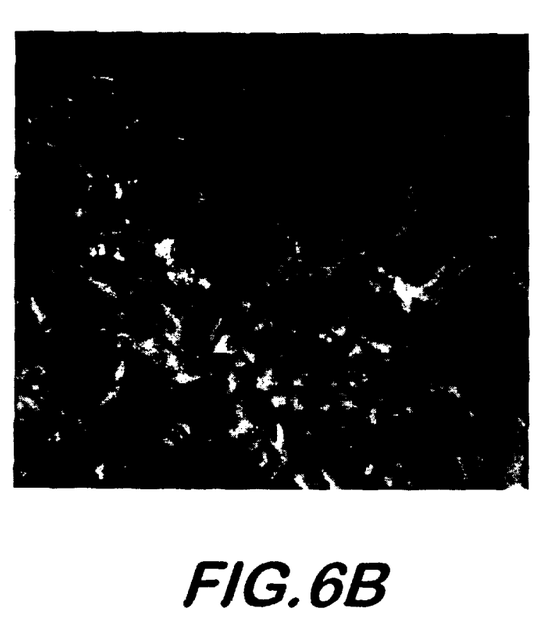

FIGS. 6A and 6B are electron-microscopic photographs of a finished target surface obtained by using sandpaper to smooth the surface and by subjecting it to air blowing and then to ultrasonic washing using 25 kHz single-frequency-oscillation. These photos show an ITO target according to Comparative Example 3 prior to the sputtering test.

As is apparent from FIGS. 6A and 6B, an infinite number of sesame-shaped chips are present on the wavy surface of the ITO target according to Comparative Example 3, or in voids therein, prior to the sputtering test.

Figure 7A:
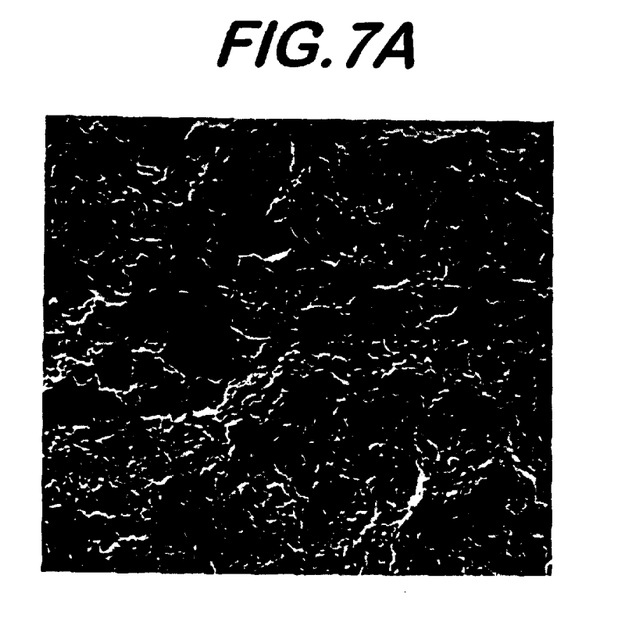
FIGS. 7A and 7B are electron-microscopic photographs of a target surface subjected to air blowing and then to ultrasonic washing using multiple-oscillations between 25 and 300 kHz according to this invention.
Figure 7B:
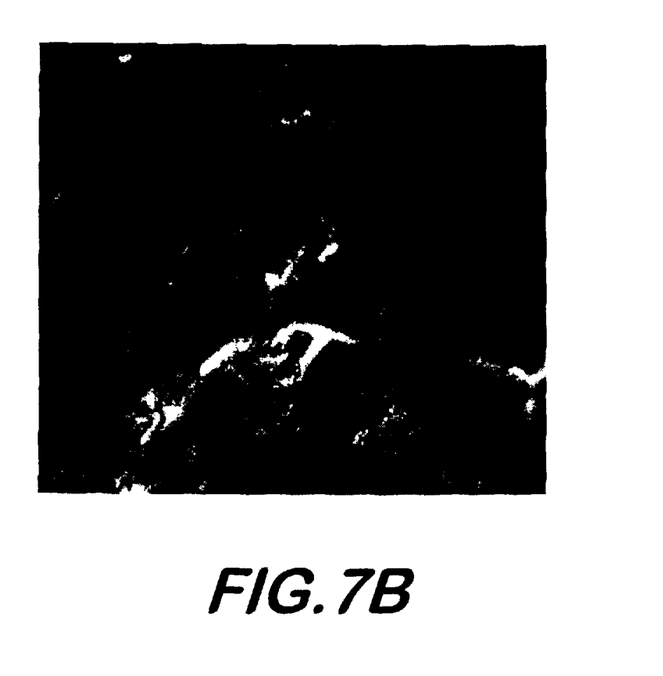

FIGS. 7A and 7B are electron-microscopic photographs of a finished ITO target surface obtained by using sandpaper to smooth the surface and by subjecting it to air blowing and then to ultrasonic washing by multiple-oscillation using 12 different frequencies between 25 and 300 kHz at intervals of 25 kHz. These photos show the ITO target according to Embodiment 1 of the present invention prior to the sputtering.

As is apparent from FIGS. 7A and 7B, in Embodiment 1 of the present invention, almost no sesame-shaped chips are observed on the wavy surface of the ITO target or in voids therein. It is thus readily understandable that the surface obtained according to this embodiment is very clean and pure.

One of the causes of the production of nodules is the presence of dust on the target surface. A large amount of ITO ground chips are deposited on the target surface, but they have been found to be too small to remove using only air blowing or only simple single frequency ultrasonic washing. The ultrasonic washing according to the present invention utilizes multiple oscillations and has been combined with the finishing and cleaning processing described above to effectively remove ITO ground powders for the first time.

Embodiment 2

To manufacture an ITO sputtering target, indium oxide powders of average particle size 2 μm and tin oxide powders of the same particle size are weighed using a balance so that their weight ratio is 90:10. A molding binder is added to these powders, and the mixture is uniformly mixed together, as in Embodiment 1. Then, the mixed powders are uniformly charged in molds (165 W×520 L) and molded under a pressure of 800 Kgf/cm$^2$ using a hydraulic press. The molded compact obtained in this manner is sintered in a pressure-sintering furnace in a pure-oxygen-gas atmosphere of 1 atm. (the absolute pressure) at 1640° C. for seven hours.

A sputtered surface of the sintered compact obtained is ground using a surface grinder and its sides are cut using a diamond cutter to obtain an ITO target material. The ITO target material has a density of 7.05 g/cm$^3$.

Then, the ITO target material is bonded to a backing plate. During a surface-finishing step after bonding, sandpaper is used to polish and smooth the materials until no traces of the grinding stone are observed. Alternatively, the material is sandblasted using zirconia beads.

Then, air is blown on the sputtered surface and an adhesive tape (film) is stuck on the surface. The tape is rubbed against the sputtered surface in such a way as to be sufficiently adhered thereto, and is then peeled off (air blowing+tape peeling) to obtain an ITO sputtering target corresponding to Embodiment 2 of the present invention.

Comparative Examples 4 and 5

Sputtered surfaces of sintered compacts obtained under the same conditions as in Embodiment 2 were ground using a surface grinder and their sides were cut using a diamond cutter to obtain ITO target materials. The ITO target materials are each bonded to a backing plate. Then, ITO sputtering targets are obtained by subjecting the sputtered surfaces to only air blowing after surface-finishing the materials with sandpaper (Comparative Example 4) and sandblasting (Comparative Example 5), respectively.

Comparison Test and Comparison of Embodiment 2 with Comparative Examples 4 and 5

The ITO sputtering targets produced according to Embodiment 2 and Comparative Examples 4 and 5 as described above underwent sputtering tests under the following conditions.

| | |
|---|---|
| Sputter gas pressure | 0.5 Pa |
| Sputter gas flow rate | 300 SCCM |
| Oxygen concentration in sputter gas | 1% |
| Leakage magnetic flux Density | 400 Gauss |
| Input sputter power density | 1 W/cm$^2$ |
| Sputter time | 20 consecutive hours |

Figure 8:
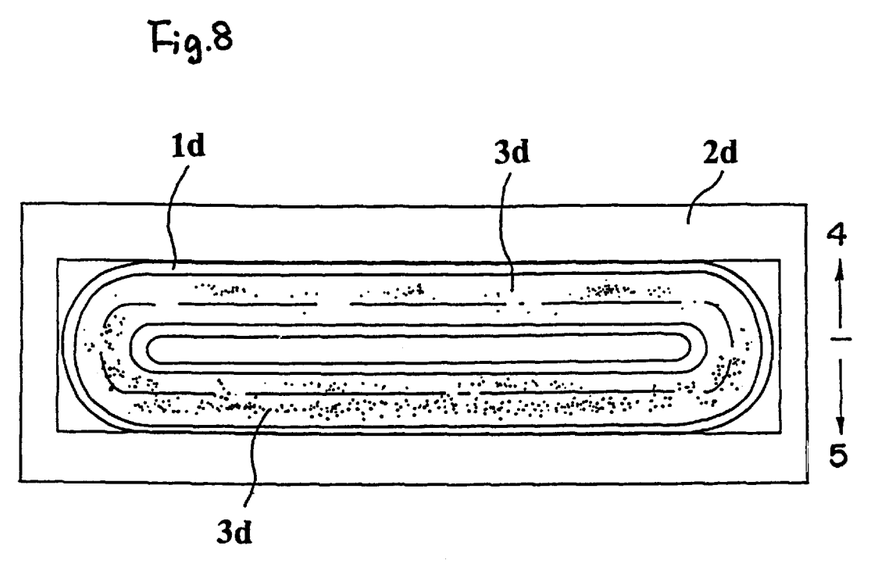
FIG. 8 is a sketch of a target that has been smoothed using sandpaper, has had its upper half subjected to air blowing and tape peeling while having its lower half subjected to only air blowing, and has then been sputtered over 20 consecutive hours.
Figure 9:
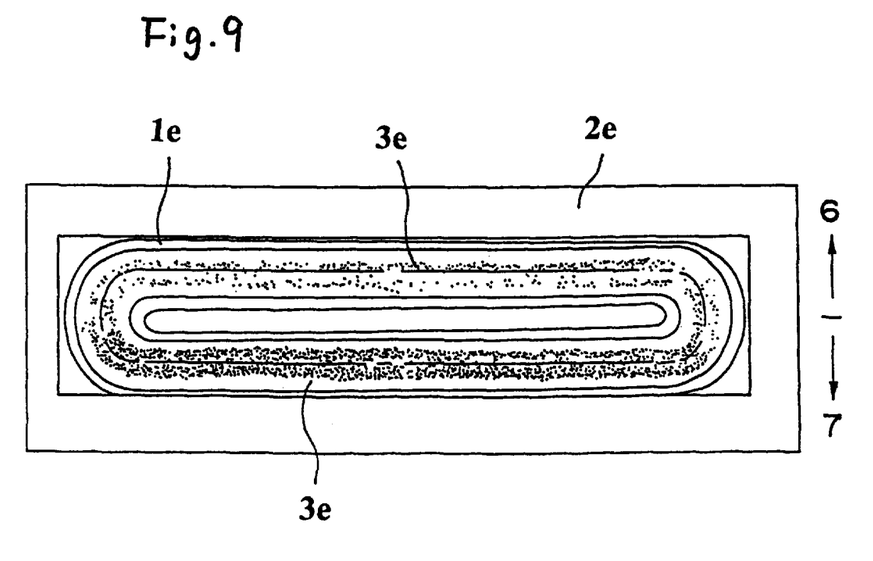
FIG. 9 is a sketch of a target that has been sandblasted, has had its upper half subject to only air blowing and tape peeling while having its lower half subjected to air blowing, and has then been sputtered over 20 consecutive hours.

The appearances of the targets after sputtering under the above conditions are illustrated in FIGS. 8 and 9. Sandpaper was used to smooth and finish the surface illustrated in FIG. 8, and zirconia beads were used to sandblast and finish the surface illustrated in FIG. 9.

The upper half 4 of the target 1d shown in FIG. 8 corresponds to Embodiment 2 of the present invention. It was subjected to air blowing and then to cleaning processing (air blowing+tape peeling) which included sticking an adhesive tape to the target surface, rubbing the tape against the target surface in such a way as to sufficiently adhere it to the surface and then peeling of the tape off the surface. The lower half 5 of the target 1d corresponds to Comparative Example 4. It was subjected to only air blowing. In FIG. 8, reference numeral 2d designates a periphery of an apparatus on which the target 1d is installed. The upper half 6 of a similar target 1e shown in FIG. 9 corresponds to Embodiment 2 of the present invention. It was subjected to air blowing and then to cleaning processing (air blowing+tape peeling) which includes sticking an adhesive tape to the target surface, rubbing the tape against the target surface in such a way as to sufficiently adhere it to the surface, and then peeling the tape off the surface. The lower half 7 of target 1e corresponds to Comparative Example 5. It was subjected to only air blowing.

As clearly shown in FIGS. 8 and 9, Comparative Examples 4 and 5 (lower halves 5 and 7) which were subjected to only air blowing have a large number of black protrusions of several $\mu$m to several mm, that is, nodules, in eroded parts 3d and 3e of a surface of the targets 1d and 1e after sputtering had been finished as compared to Embodiment 2 of the present invention corresponding to the upper halves 4 and 6 which were subjected to air blowing and tape peeling. Fewer black spots indicate a better target.

Table 2 shows the nodule covering rates of Embodiment 2 and Comparative Example 4 after the sputtering tests. The "nodule covering rate" indicates in terms of percentage the ratio of "the area of nodules/the area of the eroded part" of the surface of the sputtering target. As clearly shown in Table 2, Embodiment 2 of the present invention has a significantly reduced nodule covering rate as compared to Comparative Example 4.

TABLE 2

|  | Nodule Covering Rate (%) |
| --- | --- |
| Embodiment 2 (air blowing + tape peeling) | 0.4 |
| Comparative Example 4 (only air blowing) | 1.5 |

Figure 10A:
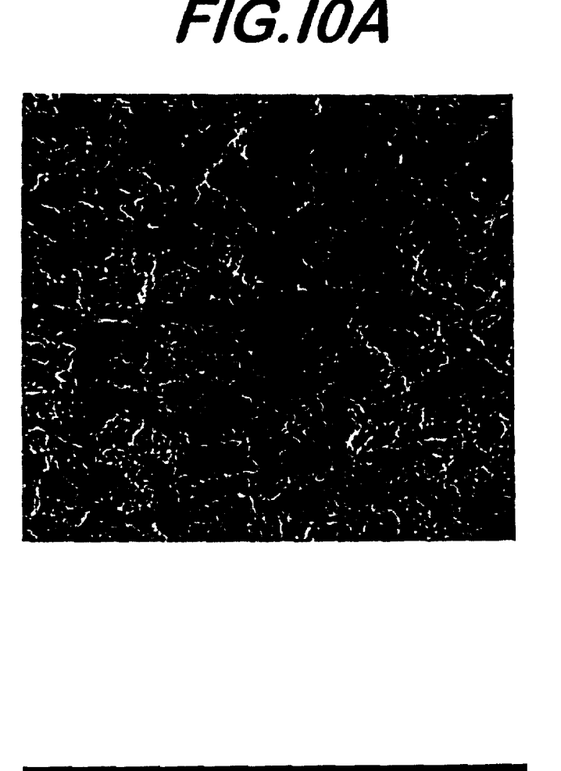
FIGS. 10A and 10B are electron-microscopic photographs of a surface of an ITO target material that has been smoothed using sandpaper and then subjected to air blowing and tape peeling according to this invention.
Figure 10B:
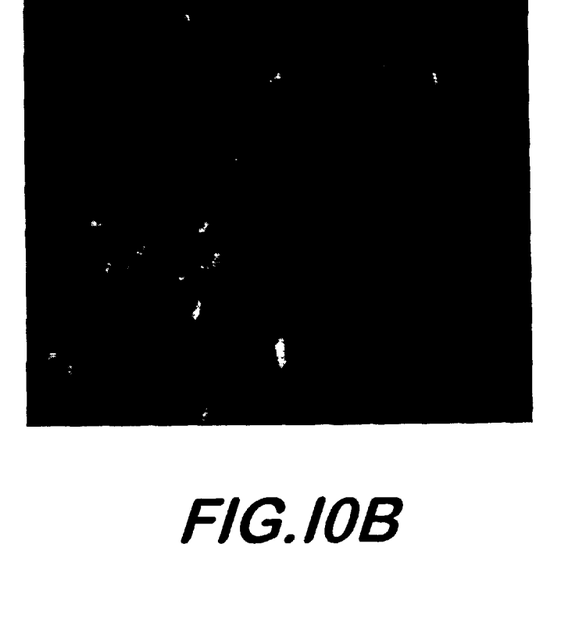

Furthermore, FIGS. 10A and 10B, which correspond to Embodiment 2, show electron-microscopic photographs of a finished surface of an ITO target material that was smoothed using sandpaper and that was then subjected to air blowing and tape peeling according to the present invention. FIG. 10A is at 500 magnification, while FIG. 10B is at 5,000 magnification. When these photographs are compared with FIGS. 4A and 4B which show electron-microscopic photographs of a surface of an ITO target material that was smoothed using sandpaper and that was then subjected to only air blowing, it is clear that the surface shown in FIGS. 4A and 4B have an infinite number of sesame-shaped chips on its wavy, wrinkled surface or in its voids.

In Embodiment 2 shown in FIGS. 10A and 10B, however, almost no such chips are observed and it is readily understandable that the surface is very clean and pure.

One of the causes of the production of nodules is the presence of dust on the target surface. A large amount of ITO ground chips are deposited on the target surface, but they have been found to be too small to remove using conventional washing processing such as only air blowing. In the preferred embodiments and comparative examples (conventional products) shown in the photographs in FIGS. 4A, 4B, 5A, 5B, 6A, 6B, 7A, 7B, 10A and 10B, measurements for the conventional products show that 30 to 50 deposited particles of average diameter 0.2 $\mu$m or more were present in an 18 $\mu$m×21.5 $\mu$m area. A similar measurement for the tape-peeling product according to Embodiment 2 of the present invention, shows that nine such particles were present, and in the multiple-oscillation ultrasonic washing product (Embodiment 1), one such particle was present.

As described above, by using the multiple-oscillation ultrasonic washing method and the method for removing deposited particles using tape peeling or combining these methods with the finishing and cleaning processing described above, a very successful, novel washing effect has been achieved, which is not provided by the conventional washing processing.

The present invention provides an ITO sputtering target and a method of cleaning the target. The invention provides a surface from which all particles are removed. The particles can be relatively large in size to relatively minute particles and can include a large amount of ITO ground chips deposited on the surface of the target. The ITO sputtering target can be used to form transparent conductive films. A clean and pure target surface enables film formation using sputtering techniques which result in few nodules to restrain abnormal discharge and prevent the production of particles on the film.

We claim:

1. An ITO sputtering target comprising a sintered compact having a sputtering surface of at least 100 $\mu$m by 100 $\mu$m which has been subjected to grinding during manufacture thereof, said surface having a plurality of ITO ground particles which are deposited thereon and which were generated by said grinding, and said ITO ground particles having an average diameter of at least 0.2 $\mu$m being limited to a total amount on said surface of no greater than 400, whereby nodule generation during sputtering of said target is reduced due to said limited amount of ITO ground particles remaining on said target.

2. An ITO sputtering target according to claim 1, wherein no more than 100 ITO ground particles are located on said surface.

3. A method for cleaning an ITO sputtering target comprising the steps of using a sintered compact having a surface as an ITO sputtering target, and subjecting said surface to multiple-oscillation ultrasonic washing.

4. A method for cleaning an ITO sputtering target according to claim 3, wherein said multiple oscillation is carried out with frequencies between 25 and 300 kHz.

5. A method for cleaning an ITO sputtering target comprising the steps of sticking an adhesive tape to a sputtered surface of a sintered compact that is used as an ITO sputtering target; rubbing the adhesive tape against the sputtered surface; and peeling the tape from the surface to remove particles deposited on the sputtered surface.

6. A method for cleaning an ITO sputtering target according to claim 5, further comprising the step of ultrasonic washing said surface of the ITO sputtering target.

7. A method for cleaning an ITO sputtering target according to claim 6, wherein said ultrasonic washing is carried out before said adhesive tape is stuck to said surface of the ITO sputtering target.

8. A method for cleaning an ITO sputtering target according to claim 6, wherein said ultrasonic washing is carried out after said adhesive tape is stuck to and peeled from said surface of the ITO sputtering target.

* * * * *